(12) United States Patent
Szymanski et al.

(10) Patent No.: US 11,493,951 B2
(45) Date of Patent: Nov. 8, 2022

(54) PRECISION LATENCY CONTROL

(71) Applicant: Rockwell Collins, Inc., Cedar Rapids, IA (US)

(72) Inventors: Anthony Szymanski, Lucas, TX (US); Nicholas J. Scarnato, Binghamton, NY (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 16/950,561

(22) Filed: Nov. 17, 2020

(65) Prior Publication Data
US 2022/0155815 A1    May 19, 2022

(51) Int. Cl.
*G06F 1/12* (2006.01)
*G06F 1/14* (2006.01)

(52) U.S. Cl.
CPC . *G06F 1/12* (2013.01); *G06F 1/14* (2013.01)

(58) Field of Classification Search
CPC .................... G06F 1/10; G06F 1/08
See application file for complete search history.

(56) References Cited

U.S. PATENT DOCUMENTS

| 7,245,240 | B1 * | 7/2007 | Nguyen ............... H03K 5/135 326/46 |
|---|---|---|---|
| 7,746,251 | B2 | 6/2010 | Gonzalez |
| 7,982,639 | B1 * | 7/2011 | Wortman ............ H04J 3/047 341/101 |
| 8,274,412 | B1 * | 9/2012 | Zhang .................. H03M 9/00 341/101 |
| 8,832,336 | B2 | 9/2014 | Morrison et al. |
| 10,104,148 | B2 | 10/2018 | Yang et al. |
| 10,141,949 | B1 * | 11/2018 | Spaeth ............. G06F 13/4291 |
| 10,439,618 | B2 * | 10/2019 | Robin ............... H03K 21/026 |
| 10,447,463 | B2 | 10/2019 | Raymond |
| 10,680,792 | B1 | 6/2020 | Sardaryan et al. |
| 10,833,839 | B1 * | 11/2020 | Tang ................... H04L 7/0091 |
| 2001/0033188 | A1 * | 10/2001 | Aung ................... H03L 7/0814 327/141 |
| 2003/0031133 | A1 * | 2/2003 | Momtaz ............... H04L 1/243 370/241 |
| 2003/0052708 | A1 * | 3/2003 | Momtaz .................. G06F 5/10 326/37 |

(Continued)

FOREIGN PATENT DOCUMENTS

KR    100933684 B1    12/2009

OTHER PUBLICATIONS

Extended Search Report in European Application No. 21207853.9 dated Apr. 22, 2022, 10 pages.

(Continued)

*Primary Examiner* — Phil K Nguyen
(74) *Attorney, Agent, or Firm* — Suiter Swantz pc llo

(57) ABSTRACT

A system and method for serializing output includes shift registers that sample a deserialized input signal at a relatively slow clock speed. Data latency between the input and output signals is controllable to a higher granularity than the input signal with bit positions corresponding to the high-speed input signal. A predictive learning algorithm receives data latency values from the input signal and corresponding data latency values from the output signal to correct and control output latency, potentially within one high speed clock cycle.

6 Claims, 7 Drawing Sheets

(56) References Cited

U.S. PATENT DOCUMENTS

| | | | |
|---|---|---|---|
| 2003/0078022 A1* | 4/2003 | Cai | H03L 1/00 |
| | | | 455/260 |
| 2003/0217214 A1* | 11/2003 | Calvignac | G06F 13/4273 |
| | | | 710/305 |
| 2005/0055617 A1 | 3/2005 | Wang et al. | |
| 2006/0202875 A1* | 9/2006 | Fujisawa | G06F 1/025 |
| | | | 341/100 |
| 2008/0187084 A1* | 8/2008 | Lim | H03K 5/135 |
| | | | 375/371 |
| 2009/0323731 A1* | 12/2009 | Lee | H04Q 11/04 |
| | | | 370/536 |
| 2012/0221882 A1* | 8/2012 | Morrison | H04L 25/14 |
| | | | 713/500 |
| 2019/0273571 A1 | 9/2019 | Bordogna et al. | |

OTHER PUBLICATIONS

Sanghani, Amit et al., "Design and implementation of a time-division multiplexing scan architecture using serializer and deserializer in GPU chips," 29th VLSI Test Symposium, 2011, pp. 219-224, doi: 10.1109/VTS.2011.5783724.

* cited by examiner

PRECISION LATENCY CONTROL

BACKGROUND

Processor latency is a great concern in many systems. Decreasing, or precisely controlling, latency to intervals of less than one nanosecond can provide more accurate control of systems and interfaces. Existing predictive algorithms provide the possibility of latency through the integrated circuit of less than a single clock period, but the resolution confined to a clock period of around 3 ns.

SUMMARY

In one aspect, embodiments of the inventive concepts disclosed herein are directed to a system and method for serializing output. Shift registers sample a deserialized input signal at a relatively slow clock speed. Data latency between the input and output signals is controllable to a higher granularity than the input signal with bit positions corresponding to the high-speed input signal.

In a further aspect, a predictive learning algorithm receives data latency values from the input signal and corresponding data latency values from the output signal to correct and control output latency, potentially within one high speed clock cycle.

It is to be understood that both the foregoing general description and the following detailed description are exemplary and explanatory only and should not restrict the scope of the claims. The accompanying drawings, which are incorporated in and constitute a part of the specification, illustrate exemplary embodiments of the inventive concepts disclosed herein and together with the general description, serve to explain the principles.

BRIEF DESCRIPTION OF THE DRAWINGS

The numerous advantages of the embodiments of the inventive concepts disclosed herein may be better understood by those skilled in the art by reference to the accompanying figures in which.

DETAILED DESCRIPTION

Figure 1:
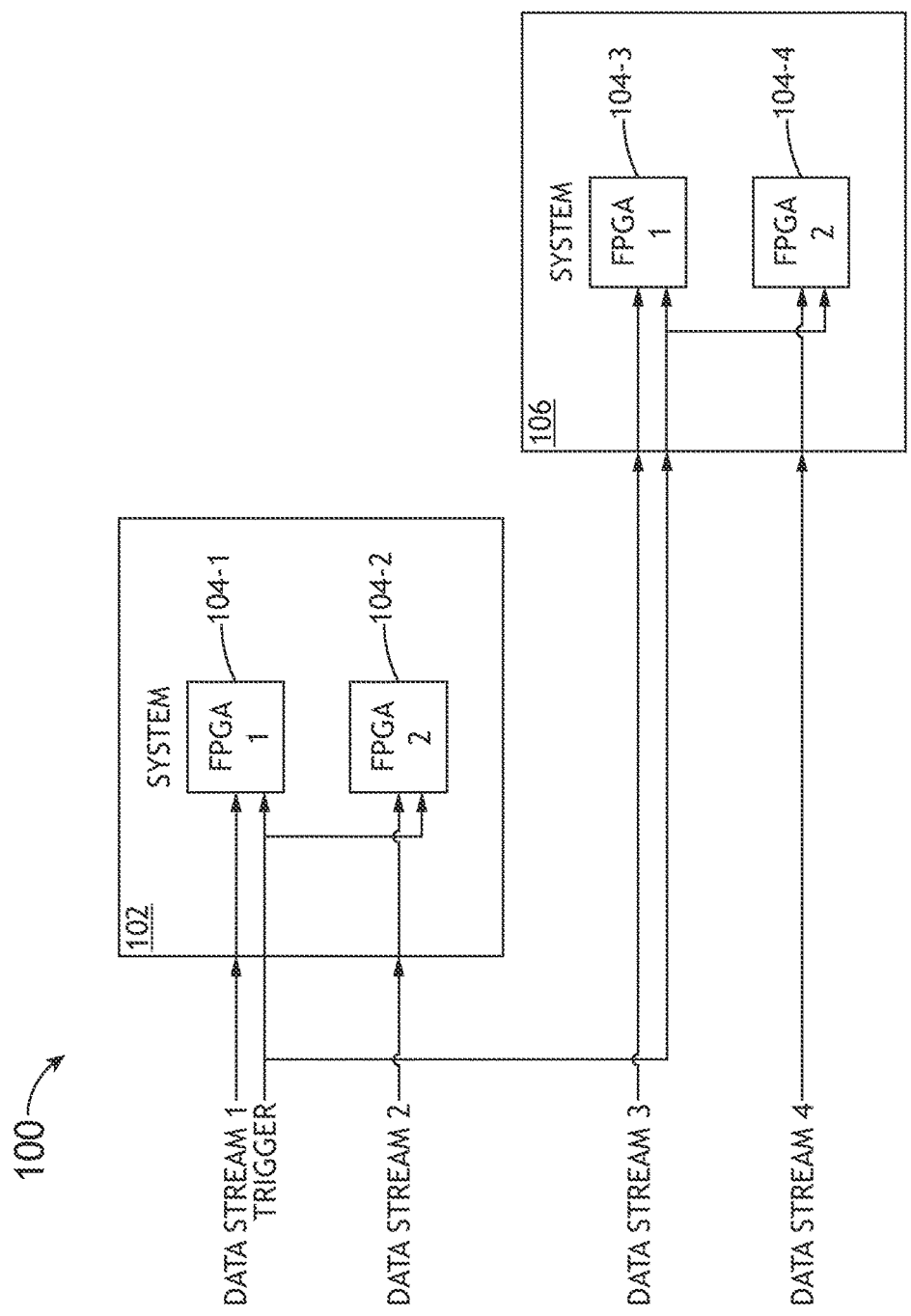
FIG. 1 shows a block diagram of a system of field programmable gate arrays useful for implementing an exemplary embodiment.

Before explaining at least one embodiment of the inventive concepts disclosed herein in detail, it is to be understood that the inventive concepts are not limited in their application to the details of construction and the arrangement of the components or steps or methodologies set forth in the following description or illustrated in the drawings. In the following detailed description of embodiments of the instant inventive concepts, numerous specific details are set forth in order to provide a more thorough understanding of the inventive concepts. However, it will be apparent to one of ordinary skill in the art having the benefit of the instant disclosure that the inventive concepts disclosed herein may be practiced without these specific details. In other instances, well-known features may not be described in detail to avoid unnecessarily complicating the instant disclosure. The inventive concepts disclosed herein are capable of other embodiments or of being practiced or carried out in various ways. Also, it is to be understood that the phraseology and terminology employed herein is for the purpose of description and should not be regarded as limiting.

As used herein a letter following a reference numeral is intended to reference an embodiment of the feature or element that may be similar, but not necessarily identical, to a previously described element or feature bearing the same reference numeral (e.g., 1, 1a, 1b). Such shorthand notations are used for purposes of convenience only, and should not be construed to limit the inventive concepts disclosed herein in any way unless expressly stated to the contrary.

Further, unless expressly stated to the contrary, "or" refers to an inclusive or and not to an exclusive or. For example, a condition A or B is satisfied by anyone of the following: A is true (or present) and B is false (or not present), A is false (or not present) and B is true (or present), and both A and B are true (or present).

In addition, use of the "a" or "an" are employed to describe elements and components of embodiments of the instant inventive concepts. This is done merely for convenience and to give a general sense of the inventive concepts, and "a" and "an" are intended to include one or at least one and the singular also includes the plural unless it is obvious that it is meant otherwise.

Finally, as used herein any reference to "one embodiment," or "some embodiments" means that a particular element, feature, structure, or characteristic described in connection with the embodiment is included in at least one embodiment of the inventive concepts disclosed herein. The appearances of the phrase "in some embodiments" in various places in the specification are not necessarily all referring to the same embodiment, and embodiments of the inventive concepts disclosed may include one or more of the features expressly described or inherently present herein, or any combination of sub-combination of two or more such features, along with any other features which may not necessarily be expressly described or inherently present in the instant disclosure.

Broadly, embodiments of the inventive concepts disclosed herein are directed to a system and method for serializing output. Shift registers sample a deserialized input signal at a relatively slow clock speed. Data latency between the input and output signals is controllable to a higher granularity than the input signal with bit positions corresponding to the high-speed input signal. A predictive learning algorithm receives data latency values from the input signal and corresponding data latency values from the output signal to correct and control output latency, potentially within one high speed clock cycle. Embodiments of the present disclosure may be better understood with reference to U.S. patent application Ser. No. 16/733,912, which is hereby incorporated by reference.

Within the context of the present disclosure, the term "latency" may be understood to refer to the time that a system takes to provide a desired output after a particular input is received.

Referring to FIGS. 1-4, exemplary embodiments of field programmable gate arrays (FPGA) and systems are shown. The system 100 may be implemented as any suitable system, such as a multiple vehicle system (e.g., at least one aircraft, at least one watercraft, at least one submersible craft, at least one automobile, and/or at least one train), a multiple FPGA system, and/or a multiple computing device system. For example, as shown in FIG. 1, the system 100 may include a system 102 and a system 106.

In some embodiments, the system 102 may be at least one computing device and/or a vehicle including at least one computing device. For example, the system 102 may include two FPGAs 104-1, 104-2, though the system 102 may include any suitable number of FPGAs.

In some embodiments, the system 106 may be at least one computing device and/or a vehicle including at least one computing device. For example, the system 106 may include two FPGAs 104-3, 104-4, though the system 106 may include any suitable number of FPGAs.

The first FPGA 104-1 may be configured to receive a first data stream. The second FPGA 104-2 may be configured to receive a second data stream. The third FPGA 104-3 may be configured to receive a third data stream. The fourth FPGA 104-4 may be configured to receive a fourth data stream. Each of the FPGAs 104-1, 104-2, 104-3, 104-4 may also be configured to receive a signal (e.g., a trigger signal or a GPS strobe). Each of the FPGAs 104-1, 104-2, 104-3, 104-4 may be configured to determine a time when the signal arrived at the input pad 202 of the particular FPGA. For example, each FPGA 104-1, 104-2, 104-3, 104-4 may be configured for: timestamping data with the time when the signal arrived at the input pad 202; utilizing the time when the signal arrived at the input pad 202 to perform data alignment; and/or utilizing the time when the signal arrived at the input pad 202 to perform clock synchronization operations. Some embodiments may be configured to maintain precise time synchronization across multiple FPGAs or systems. Some embodiments may be configured to increase accuracy in timestamping of collected data for post processing multiple systems. Some embodiments may allow for precision triggering to be better aligned to the trigger. Some embodiments may allow for data alignment across multiple inputs (e.g., of a single chip, of multiple chips, or of multiple systems).

Figure 2:
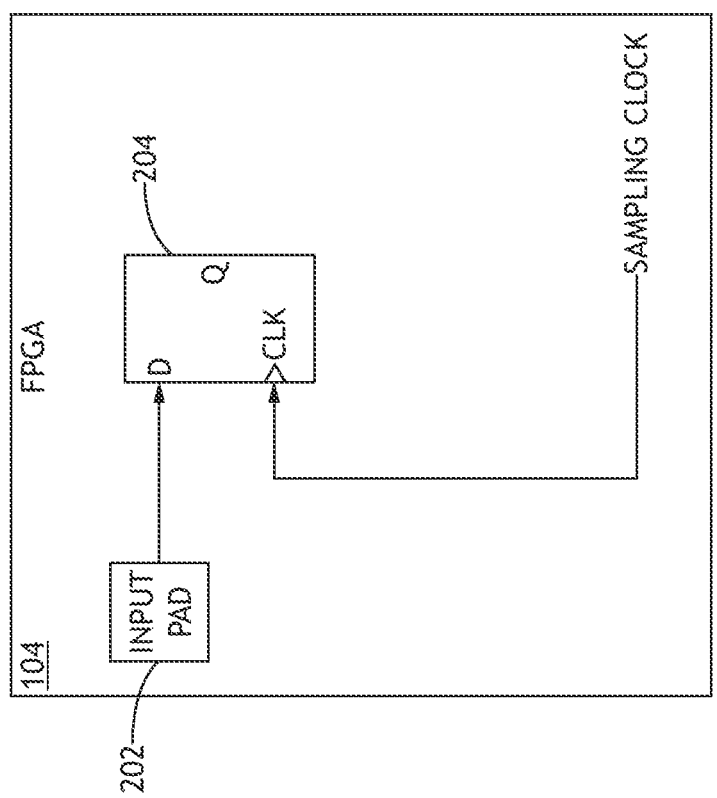
FIG. 2 shows a block diagram of a field programmable gate array useful for implementing an exemplary embodiment.
Figure 3:
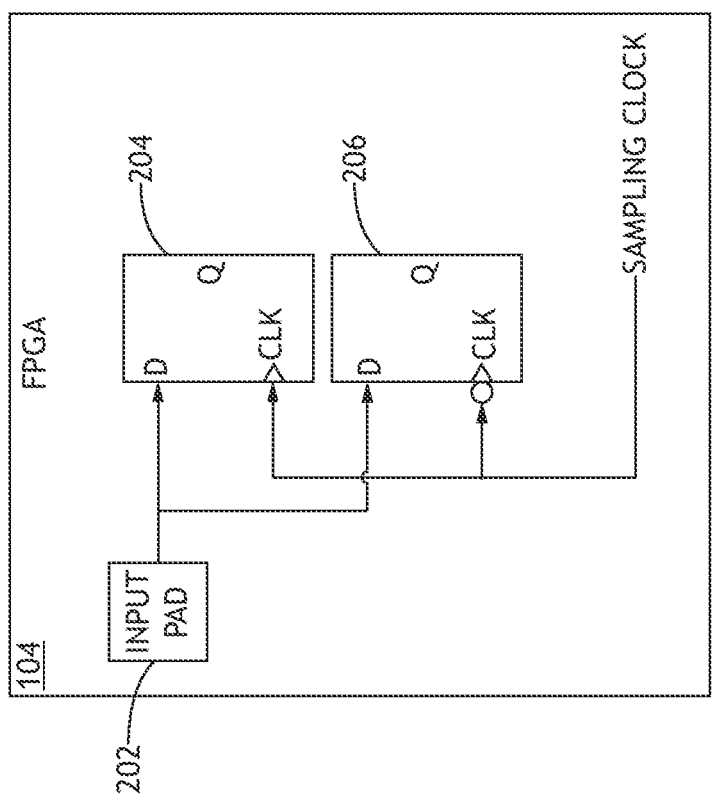
FIG. 3 shows a block diagram of a field programmable gate array useful for implementing an exemplary embodiment.
Figure 4:
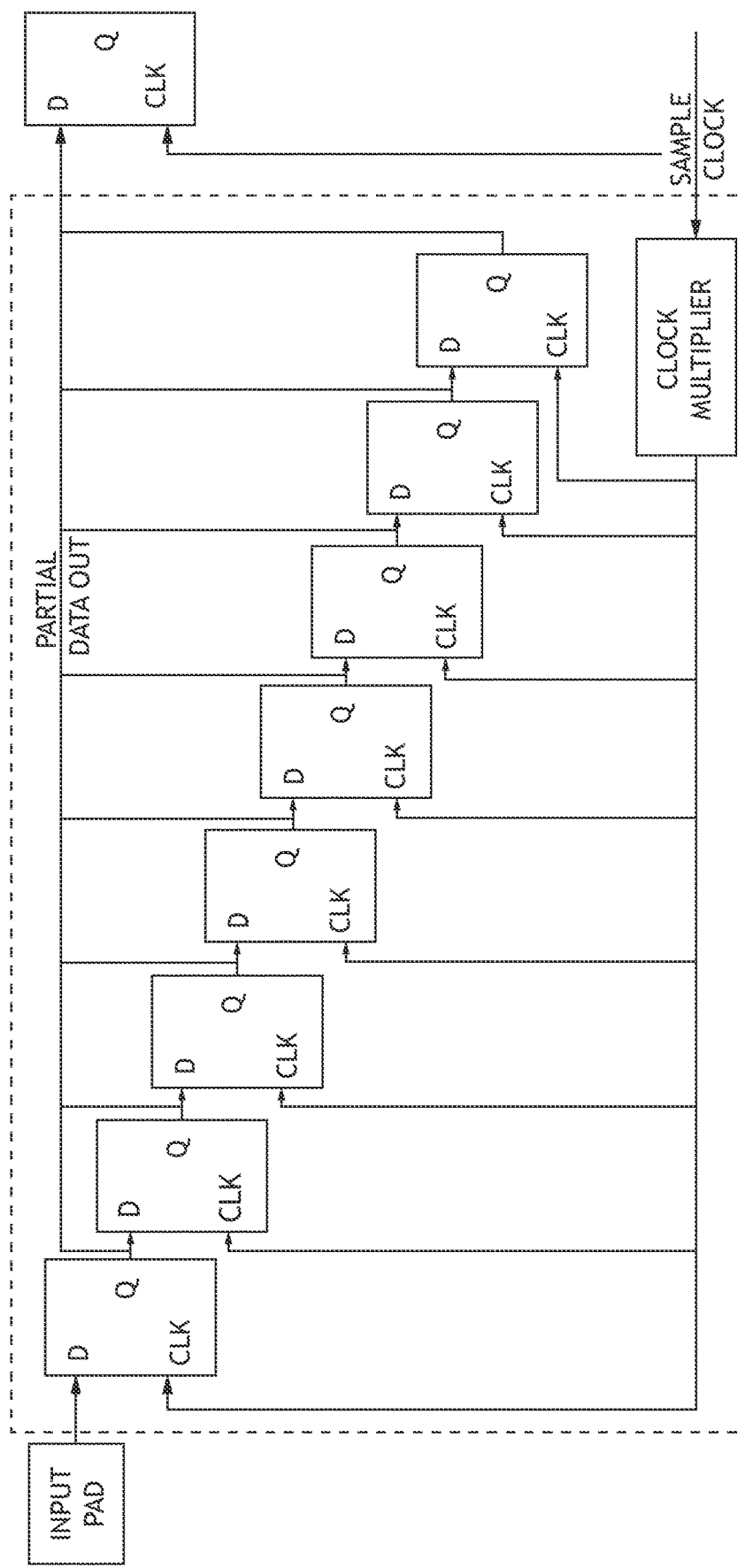
FIG. 4 shows a block diagram of a field programmable gate array useful for implementing an exemplary embodiment.

Referring to FIGS. 2-4, each FPGA 104 may include at least one input pad 202 (e.g., an input pin or an input ball), at least one input register 204, at least two DDR registers 206, at least one input serializer 208, and/or at least one x-bit wide shift register (e.g., input deserializer 214). In the present context "deserializer" refers to a structure that takes in singular data elements and combines them in to a multi-part data structure, typically providing the multi-part structure at a slower rate than the singular data portions.

The input pad 202 may be configured to connect to a circuit card assembly (e.g., a printed circuit board (PCB)) and to receive a signal (e.g., a trigger signal or a GPS strobe).

The input register 204 may be located in the FPGA 104 directly behind the input pad 202. In some embodiments, the input register may have a maximum sample rate of approximately 300 megahertz (MHz), though any suitable sample rate may be used.

The DDR registers 206 may be a set of two registers sampling on opposite edges of a sample clock to improve data rates to twice the sample clock of the input register. For example, the DDR registers 206 may have a sample rate of approximately 600 MHz, though any suitable sample rate may be used.

The input serializer 208 may include a clock multiplier 212 and a plurality of shift registers 210-1, 210-2, 210-3, 210-4, 210-5, 210-6, 210-7, 210-8 that may be able to sample at rates many times the sample clock rate of the input register 204. For example, the input serializer 208 may be configured to sample at approximately 1.8 GHz, though any suitable sample rate may be used. The input serializer 208 may include x serializer shift registers 210, wherein x is an integer greater than or equal to 2. For example, x may be 8 or 16, though any suitable number greater than 2 may be used. The input serializer 208 may be configured to receive the signal, wherein the signal may pass through each serializer shift register 210 in series. The input serializer 208 may be configured to output parallel data (e.g., an x-bit serial data word) indicative of the signal. Each serializer shift register 210 may have a time period of a serializer clock of the input serializer 208, wherein the input serializer 208 may take x time periods to complete output of the parallel data.

The x-bit wide shift register (e.g., input deserializer 214) may be coupled to the input serializer 208. The x-bit wide shift register may be configured to receive the parallel data (e.g., an x-bit serial data word) from the input serializer 208. The x-bit wide shift register may be sampled at a shift register clock to provide a value with each bit shift of the value corresponding to one of the x time periods for the parallel data. A speed of the shift register clock may be less than a speed of the serializer clock. The x-bit wide shift register may have a shift register latency value indicative of an amount of time for the signal to travel from the input pad 202 through the x-bit wide shift register.

The FPGA 104 may be configured to: determine a time corresponding to in which of the x time periods the signal arrived at the input serializer 208 based at least on the value; and determine a time when the signal arrived at the input pad 202 by subtracting from the current time a sum of the shift register latency value and the time corresponding to in which of the x time periods the signal arrived at the input serializer 208 based on the value. For example, the FPGA 104 may be further configured to determine the time corresponding to in which of the x time periods the signal arrived at the input serializer 208 based at least on a position of a first non-zero in the value in the case of an active high input, or position of a first zero in the case of an active low input. In some embodiments, the determined time when the signal arrived at the input pad 202 may be accurate to within the time period of the serializer clock of the input serializer 208. Some embodiments may include a second FPGA 104, wherein the second FPGA 104 may be configured to receive the signal and determine a time when the signal arrived at the second FPGA input pad 202, wherein the FPGA 104 and the second FPGA 104 may be configured to be synchronized by utilizing the time when the signal arrived at the input pad 202 and the time when the signal arrived at the second FPGA input pad 202. Some embodiments may include a first computing device including the FPGA 104 and second computing device including a second FPGA 104, wherein the second FPGA 104 may be configured to receive the signal and determine a time when the signal arrived at the second FPGA input pad 202, wherein the FPGA 104 and the second FPGA 104 may be configured to be synchronized by utilizing the time when the signal arrived at the input pad 202 and the time when the signal arrived at the second FPGA input pad 202.

It may be appreciated that while specific embodiments describe implementation via FPGAs, other technologies such as application specific integrated circuit technology may be utilized.

Figure 5:
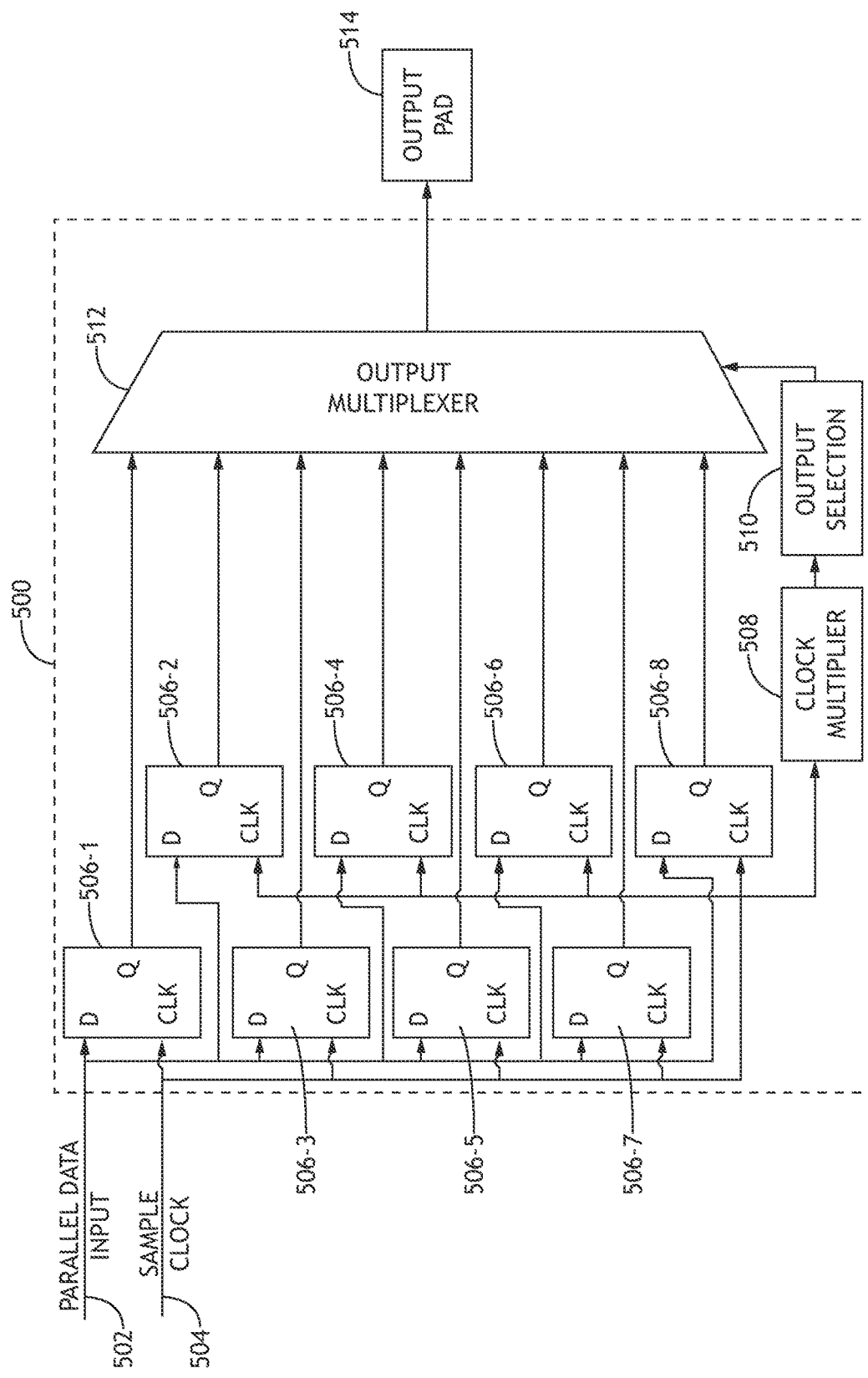
FIG. 5 shows a block diagram of an output serializer according to an exemplary embodiment.

Referring to FIG. 5, a block diagram of an output serializer 500 according to an exemplary embodiment us shown. The output serializer 500 provides control resolution of less than one nanosecond at an output pad 514 by taking a single multi-part input and produces output data in singular parts at a faster rate than the multi-part data. One or more input deserializers are in data communication with a parallel data input pin 502 of the output serializer 500 to determine the time of arrival of a signal into the output serializer 500 with accuracies less than one nanosecond.

The output serializer 500 comprises a plurality of shift registers 506-1, 506-2, 506-3, 506-4, 506-5, 506-6, 506-7, 506-8, each shift register 506-1, 506-2, 506-3, 506-4, 506-5, 506-6, 506-7, 506-8 configured to receive a deserialized input signal via the parallel data input pin 502 and a sampling clock signal via a clock pin 504. Each shift registers 506-1, 506-2, 506-3, 506-4, 506-5, 506-6, 506-7, 506-8 samples bits from the deserialized input signal and outputs those sampled bits. The shift registers 506-1, 506-2, 506-3, 506-4, 506-5, 506-6, 506-7, 506-8 are organized in parallel.

In at least one embodiment, the deserialized input signal comprises a trigger signal that is identified by a first shift register 506-1 as initiating a processing phase. The deserialized input signal then propagates to successive parallel shift registers 506-2, 506-3, 506-4, 506-5, 506-6, 506-7, 506-8. The sampling clock signal operates at a lower clock cycle as compared to a broader system clock cycle.

In at least one embodiment, a multiplexer 512 in data communication with each of the shift registers 506-1, 506-2, 506-3, 506-4, 506-5, 506-6, 506-7, 506-8 selects an output from the multiplexer 512 to the output pad 514. The multiplexer 512 comprises a logic structure to select an input value based on an indexing value. An output selection element 510 drives the multiplexer output by pulling a single bit from each shift registers 506-1, 506-2, 506-3, 506-4, 506-5, 506-6, 506-7, 506-8 at high speed. In at least one embodiment, the output selection element 510 is driven by a clock multiplier 508 that receives the sampling clock signal and outputs a faster clock signal. The multiplexer 512 maybe indexed at the speed of the high-speed serial output putting out one bit of the parallel data during each high-speed clock cycle. Associating the high-speed clock cycle serial output with the slower cock cycle of the deserialized input allows for precise latency control.

In at least one embodiment, the output pad 514 comprises or is connected to an output register that is loaded via the multiplexer 512 using the sampling clock signal. The control offered by precisely determining time of arrival of an input and being able to also precisely control the output timing is beneficial for many signal processing algorithms.

Figure 6:
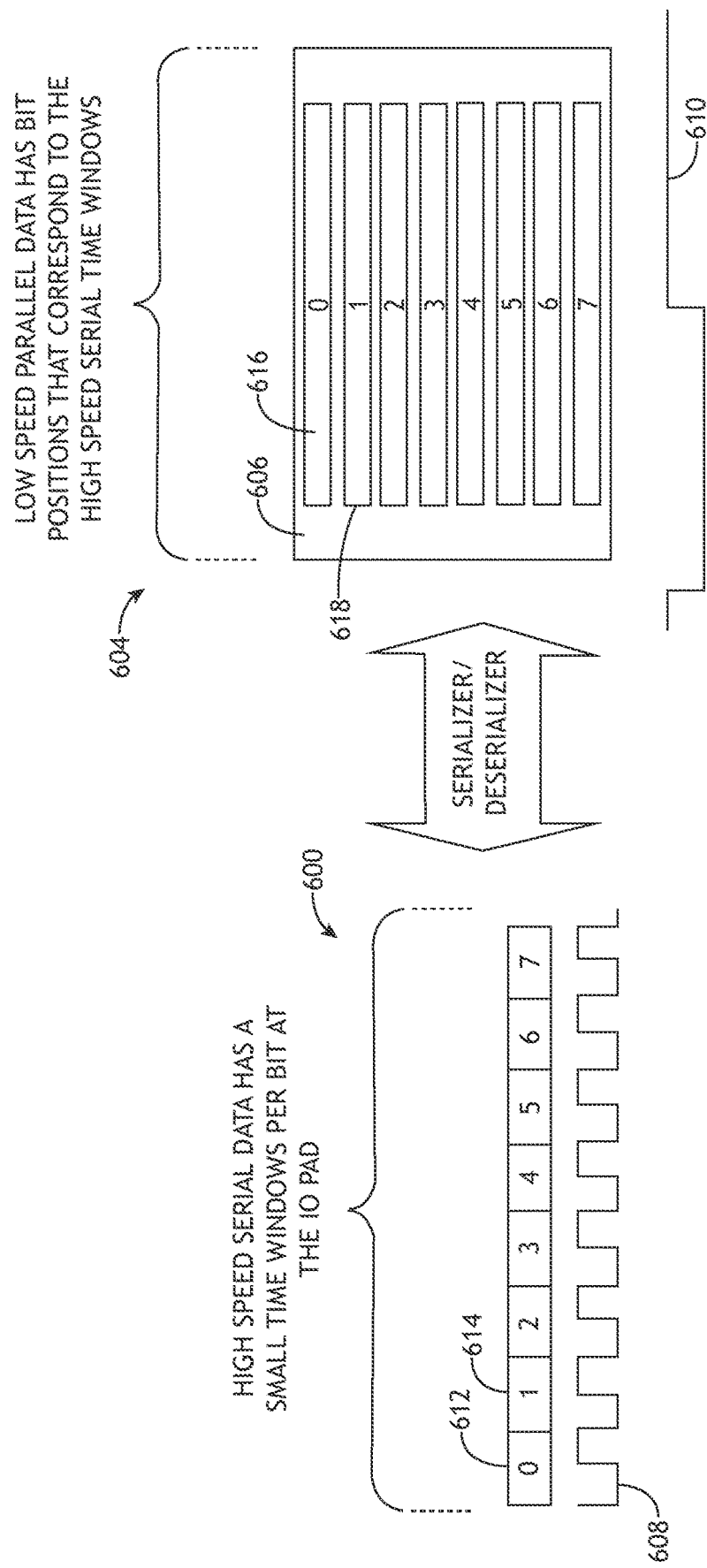
FIG. 6 shows a block diagram of a serial-to-parallel data relationship according to an exemplary embodiment.

Referring to FIG. 6, a block diagram of a serial-to-parallel data relationship according to an exemplary embodiment us shown. Serialized data 600 and deserialized data 604 representing the same information may be related according to corresponding clock cycles 608, 610. High speed serial data 600 is organized in series with relatively small time windows per bit 612, 614; the time window defined by a fast clock cycle 608. Low speed deserialized data 604 is organized into a parallel word data structure 606 with bit positions 616, 618 corresponding to the fast clock cycle 608 but an overall slow clock cycle 610. Data processed according the systems and methods of the present disclosure comprise low speed serial where each bit 616, 618 of the parallel word data structure 606 is directly related to a particular high-speed clock period at the output pin.

In at least one embodiment, the relationship between serialized data 600 and deserialized data 604 is used to precisely determine input arrival time and control output departure time. The latency of the total circuit can be tuned within sub nanosecond intervals from when an input is received to when the output is driven.

Figure 7:
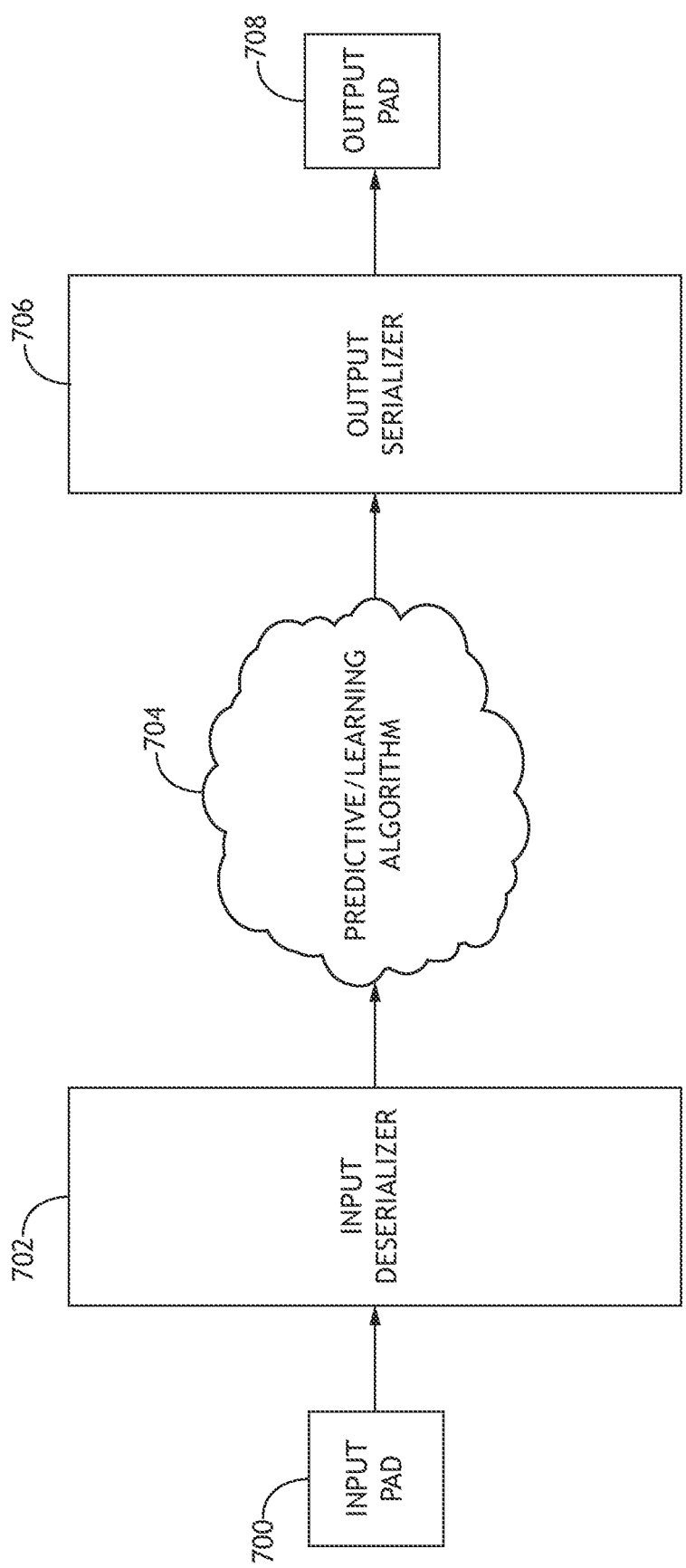
FIG. 7 shows a block diagram of a precision latency control system according to an exemplary embodiment.

Referring to FIG. 7, a block diagram of a precision latency control system according to an exemplary embodiment us shown. The system comprises an input deserializer 702 fed by an input signal at an input pad 700 and an output serializer 706 that receives a deserialized packet and outputs a serialized signal at an output pad 708.

In at least one embodiment, a latency prediction process 704 embodied in a processor receives the deserialized packet and makes a latency prediction for the serialized signal. The latency prediction may allow latency to be tuned within one nanosecond from the trigger signal input to an output signal. The prediction process 704 may comprise a defined algorithm utilizing knowledge of latency within the input serializer 702 and output deserializer 706 to determine a parallel value to load into the output shift register.

In at least one embodiment, the prediction process 704 may comprise a learning algorithm such as a neural network trained via a training set relating latency between input signals and output signal which may be updated periodically or continuously as the system operates.

In at least one embodiment, a high-speed input deserializer 702 and output serializer 706 allows control down to periods of less than one nanosecond. Parallel data is fed into a predictive, or learning algorithm that Embodiments of the present disclosure could aid in simulations by providing very precise control over trigger latencies throughout a system to test limits of users. Precision control may be used for other latency sensitive applications such as video processing, guidance systems, geo-location, radar processing, jamming, edge processing, and cloud processing. In at least one embodiment, precision latency timing may be useful for automatically testing limits of equipment via precisely controlled input signals.

Implementation of a system using precision latency control can provide a greater granularity of control from input signal to output signal as compared to existing systems. Various algorithms may reduce system latency to provide better control for displays, even zero latency.

It is believed that the inventive concepts disclosed herein and many of their attendant advantages will be understood by the foregoing description of embodiments of the inventive concepts disclosed, and it will be apparent that various changes may be made in the form, construction, and arrangement of the components thereof without departing from the broad scope of the inventive concepts disclosed herein or without sacrificing all of their material advantages; and individual features from various embodiments may be combined to arrive at other embodiments. The form herein before described being merely an explanatory embodiment thereof, it is the intention of the following claims to encompass and include such changes. Furthermore, any of the features disclosed in relation to any of the individual embodiments may be incorporated into any other embodiment.

What is claimed is:

1. A system comprising:
    an input deserializer;
    an output serializer comprising:

a parallel data input configured to receive a trigger signal comprising a multi-part input from the input deserializer;
a plurality of shift registers, each of the plurality of shift registers configured to:
  receive the trigger signal and a sampling clock signal;
  identify the trigger signal to initiate a processing phase; and
  sample parallel data from the trigger signal at clock cycle defined by the sampling clock signal; and
  a clock multiplier; and
an output multiplexer configured to receive outputs from each of the plurality of shift registers and index the outputs according to an output clock having a clock cycle higher than the clock cycle defined by the sampling clock signal
wherein the clock cycle defined by the sampling clock signal is slower than a clock cycle defined by an output signal and the clock multiplier is configured to increase the sampling clock signal to the output clock.

2. The system of claim 1, wherein the output multiplexer outputs one bit of the parallel data per clock cycle defined by the output signal.

3. The system of claim 1, wherein the output multiplexer is configured to:
  determine an output parallel signal; and
  output the output parallel signal from the plurality of shift registers to an output register.

4. The system of claim 3, further comprising a predictive artificial intelligence element configured to determine the output parallel.

5. The system of claim 4, wherein the predictive artificial intelligence element comprises a learning algorithm trained on latency values from the input deserializer and output serializer.

6. The system of claim 3, wherein the output register is loaded according to the clock cycle defined by the output signal.

* * * * *